United States Patent [19]

Lienhard et al.

[11] Patent Number: 4,596,950

[45] Date of Patent: Jun. 24, 1986

[54] COMPENSATED TRANSDUCER

[75] Inventors: Heinz Lienhard, Zug; Jan Petr, Oberwil, both of Switzerland

[73] Assignee: LGZ Landis Gyr Zug AG, Zug, Switzerland

[21] Appl. No.: 332,215

[22] Filed: Dec. 18, 1981

[30] Foreign Application Priority Data

Dec. 24, 1980 [CH] Switzerland .................. 9568/00

[51] Int. Cl.$^4$ .................. G01R 33/00; G01R 33/02
[52] U.S. Cl. .................. 324/117 R; 324/252
[58] Field of Search ............ 324/117 R, 117 H, 127, 324/252, 249; 338/32 H; 323/294, 368; 307/309

[56] References Cited

FOREIGN PATENT DOCUMENTS 2344508 9/1978 Fed. Rep. of Germany .
2825397 8/1979 Fed. Rep. of Germany .

OTHER PUBLICATIONS

Herbert et al., "Thin Film Magnetoresistance Magnetometer"; The Review of Scientific Instruments; vol. 37; No. 10; Oct. 1966; pp. 1321-1323.

Primary Examiner—Ernest F. Karlsen
Attorney, Agent, or Firm—Marmorek, Guttman & Rubenstein

[57] ABSTRACT

A compensated measurement transducer for measuring a first current generates a first magnetic field of a predetermined direction which flows in a first circuit including a first conductor; a second current substantially similar to the first current is generated in a second circuit and the first current is measured by obtaining the value of the second current. The second circuit includes a compensating current conductor, which generates a second magnetic field, compensating the first magnetic field, a Wheatstone bridge to which both magnetic fields are applied, and an amplifier connected to the output of the Wheatstone bridge, and coupled to the compensating current conductor. An auxiliary magnetic field is applied to the Wheatstone bridge, which is connected to a current- or voltage-source, and includes four ferromagnetic and magnetoresistive thin film. The magnetic fields have a direction along the direction of the hard magnetic axes of the thin films, and the thin films are so positioned that the magnetization of two electrically oppositely disposed thin films, which results from the application of the first and second magnetic fields thereof, is rotated in a direction opposite to the correspondingly resulting magnetization of the remaining thin films, following application of the auxiliary magnetic field to the thin films.

8 Claims, 7 Drawing Figures

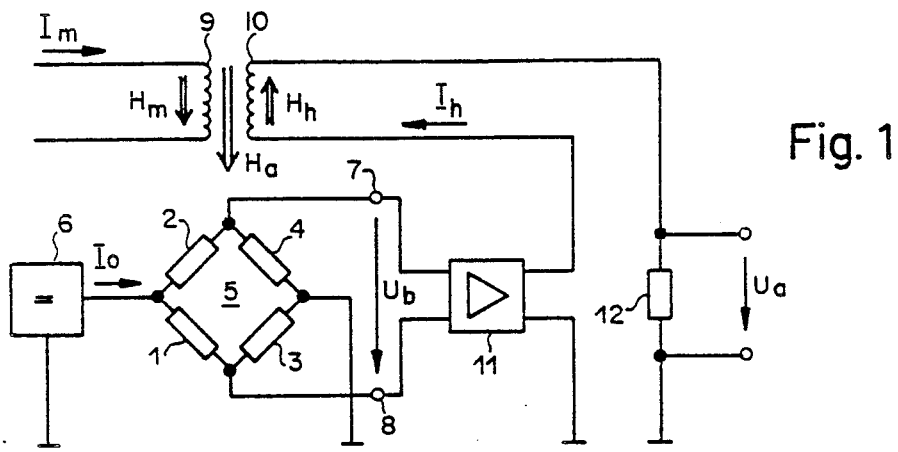
Fig. 1
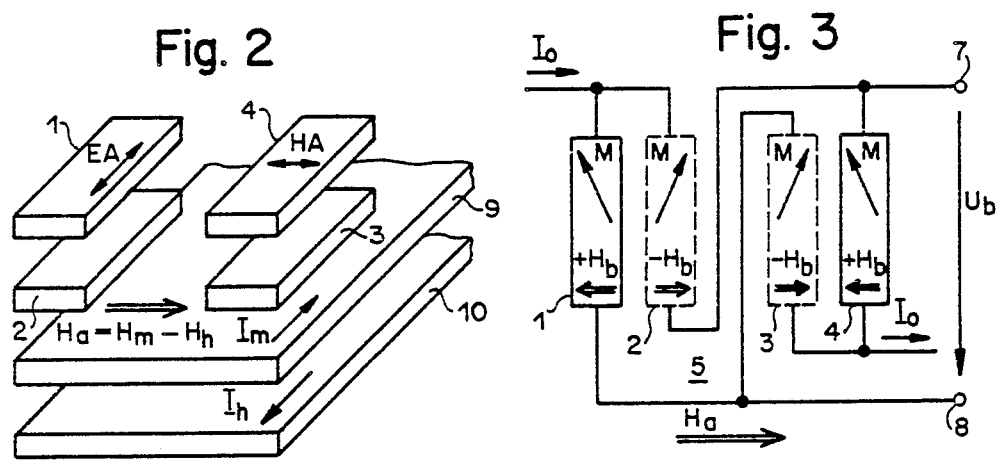
Fig. 2
Fig. 3
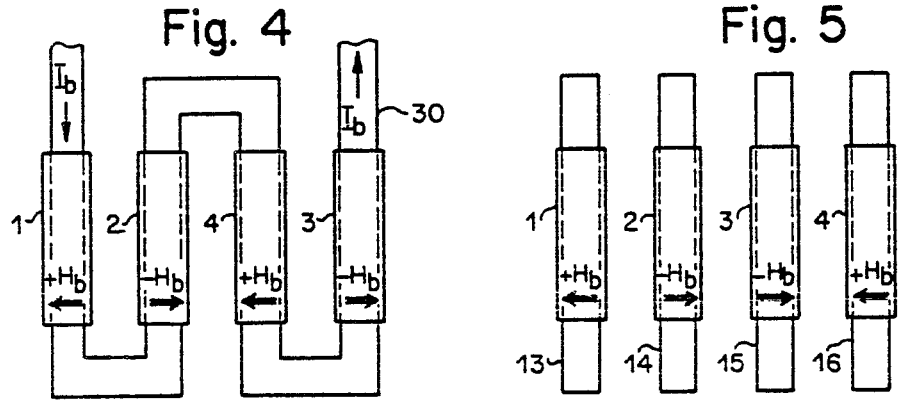
Fig. 4
Fig. 5

COMPENSATED TRANSDUCER

CROSS-REFERENCE TO COPENDING APPLICATIONS

Reference should also be made to copending application Ser. No. 188,339, filed on Sept. 18, 1980, now U.S. Pat. No. 4,385,273, entitled "Transducer for Measuring a Current-Generated Magnetic Field" and copending applications entitled "Magnetoresistive Current Detector", and "System for Measuring Electrical Output or Energy", filed concurrently, in all of which one of the applicants of the present application is a co-inventor, and which are assigned to the same assignee as the present invention.

BACKGROUND OF THE INVENTION

From German Pat. No. DE-AS 2621302 there is known a compensated measurement transducer for measuring a first current generating a first magnetic field of a predetermined direction and flowing in a first circuit, including a first conductor, by generating a second current substantially similar to the first current in a second circuit, and obtaining the value of the second current. The second circuit includes a compensating current conductor generating a second magnetic field having a direction opposite to the predetermined direction, so as to compensate the first magnetic field, a magnetic transducer having a first and second magnetic field applied thereto, and an amplifier connected to the output of the magnetic transducer and coupled to the compensating current. The conductor and compensating current conductor are primary and secondary windings of the transformer, respectively, and are wound around a magnetic core. The magnetic transducer is a Hall-effect transducer, which is disposed in the air gap of the magnetic core.

In a compensated measurement transducer employing a Hall-effect transducer it is not possible to omit the magnetic core as the magnetic fields, which are to be measured, must be applied at right angles to the main plane of the plate-shaped Hall-effect transducer, which is only possible by means of a magnetic core at an adequate efficiency, in view of the low sensitivity of the Hall-effect transducer.

From the IEEE Transaction on magnetics, November 1976, pages 813 to 815, there is also known a Wheatstone bridge including magnetoresistive thin films for measurement of a magnetic field generated by a current. From German Pat. No. DE-AS 2344508 it is also known to measure a magnetic field by means of a thin ferromagnetic film and to compensate the magnetic field to be measured by means of a compensating coil generating a controllable and known magnetic field; in this application, however, the magnetoresistive effect of the thin films are not made use of, but only an induced electrical signal is analyzed. The equivalent U.S. patent is No. 3,931,572.

From U.S. Pat. No. 3,820,089 there is known a magnetoresistive bridge for detection of magnetic bubbles.

From U.S. Pat. No. 3,546,579 there is known a magnetometer utilizing a thin-film bridge, in which the thin films are magnetized along their easy axes.

A compensated measurement transducer of the initially described type employing a Hall-effect sensor in the air gap of the magnetic core is also known from U.S. Pat. No. 3,649,912.

SUMMARY OF THE INVENTION

It is accordingly one of the principal objects of the present invention to devise a compensated measurement transducer of the aforedescribed kind, which is simple in construction, devoid of a magnetic core, and nevertheless has a high measurement accuracy.

This object is attained in a compensated measurement transducer of the aforedescribed kind by generating an auxiliary magnetic field, and by applying it to the magnetic transducer, and wherein the magnetic transducer comprises a Wheatstone bridge adapted to be connected to a current- or voltage-source, and including four ferromagnetic and magnetoresistive films which have hard and easy magnetic axes respectively. All the magnetic fields have a direction along the direction of the hard magnetic axes of the thin films, and the thin films are so positioned, that the magnetization of two electrically oppositely disposed thin films, resulting from the application of the first and second magnetic fields thereto, is rotated in a direction opposite to that of the resulting magnetization of the remaining thin films, following application of the auxiliary magnetic fields to the thin films.

Other objects of the invention will in part be obvious, and will in part appear hereinafter.

BRIEF DESCRIPTION OF THE DRAWINGS

For a fuller understanding of the nature and objects of the invention, reference should be had to the following detailed description, taken in connection with the accompanying drawings, in which:

FIG. 1 is a block circuit diagram of the transducer according to the present invention;

FIG. 2 is a fragmentary perspective exploded view of portions of the transducer;

FIG. 3 is a circuit diagram of the Wheatstone bridge of the transducer;

FIG. 4 is a diagram of a first variant of the bridge;

FIG. 5 is a diagram of a second variant of the bridge;

DESCRIPTION OF THE PREFERRED EMBODIMENTS

Figure 6:
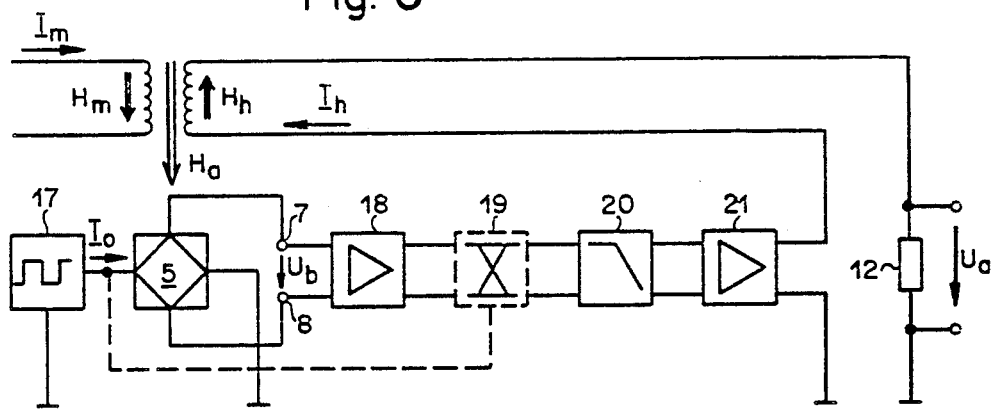
FIG. 6 is a block circuit diagram of another version of the present invention.

In carrying the invention into effect and referring in particular to FIG. 1, four ferromagnetic mangetoresistive thin films form an electrical Wheatstone bridge 5. The Wheatstone bridge 5 is fed by a current- or voltage-source 6, and constitutes a magnetic transducer having output terminals 7 and 8, which is subjected to an external magnetic field $H_a$. A current $I_m$, to be measured, generates a first magnetic field $H_m$, and a compensation current $I_h$ flowing in a compensating current conductor 10, generates a second magnetic field $H_h$ having a direction opposite to the predetermined direction of the first magnetic field $H_m$, so that $H_a = H_m - H_h$. The output voltage of the Wheatstone bridge 5 $U_b$ appearing across the terminals 7 and 8 is fed to the input of a difference amplifier 11, whose output is connected to the compensating current conductor 10 so as to generate a compensating current $I_h$. While the current $I_m$ flows in a first circuit the compensating current $I_h$ flows in a second circuit which includes a resistor 12 across which there is developed an output voltage $U_a$ which is proportional to the compensating current $I_h$. As a result of the feedback effect of the connection of the Wheatstone bridge 5, of the difference amplifier 11, and the compensating current conductor 10 which form a control loop the relation between the compensating current $I_h$ and the magnetic external magnetic field $H_a$ is such that the latter practically disappears, so that $I_h = I_m$.

The thin films 1 and 4, which are not drawn to scale as shown in FIG. 2, are disposed in a first common plane, and the thin films 2 and 3 are disposed in a second common plane parallel to the first plane. The thin film 1 is disposed exactly above the thin film 2, and the thin film 4 is disposed exactly above the thin film 3. The thin films 1 and 2, as well as the thin films 3 and 4 have equal respective thicknesses, and form two thin film pairs, namely they are coupled to one another magnetostatically, and insulated from one another by a (non-illustrated) very thin insulating layer. The current to be measured $I_m$ flowing in the first or measurement conductor 9, and the compensating current $I_h$ flowing in the compensating current conductor 10, flow in the direcion of the easy magnetic axis EA of the thin films 1 through 4. Flat conducting strips or flat coils preferably serve as the conductors 9 and 10, and the Wheatstone bridge 5 is disposed in a zone, in which both the current $I_m$ to be measured, as well as the compensating current $I_h$ generate respectie homogeneous magnetic fields $H_m$ and $H_h$, which magnetize the thin films 1 through 4 in the direction of the hard magnetic axes $H_A$. As the thin films 1 through 4, the first conductor 9, and the second conductor 10 are disposed in respective parallel planes very close to one another and need only be insulated from one another by respective thin layers, it is not necessary to provide any magnetic core, and the magnetic fields $H_m$ and $H_h$ are coupled to the thin films 1 through 4 without any magnetic core at a high efficiency.

In FIG. 3 the thin films 2 and 3 are shown dotted to indicate that they are disposed below the thin films 1 and 4 respectively. The topmost ends of the thin films 1 and 2 shown in FIG. 3, and the lowermost ends of the thin films 3 and 4 are connected to a current- or voltage-source 6, shown in FIG. 1, which causes a current $I_o$ to flow in the Wheatstone bridge 5. The lowermost end of the thin film 2 and the topmost end of the thin film 4 are connected to the output terminal 7, and the lowermost end of the thin film 1 as well as the topmost end of the thin film 3 are connected to the output terminal 8 of the Wheatstone bridge 5.

A current $\frac{1}{2} I_o$ flowing in the thin film 2 generates an auxiliary magnetic field $H_b$ in the thin film 1, which is directed, as shown in FIG. 3, leftward, so that the magnetizing vector M in the thin film 1 is rotated in a counter-clockwise direction by a predetermined angle with respect to the easy magnetic axis EA. In an analgous manner there is generated in the thin film 4 as a result of a current $\frac{1}{2} I_o$ flowing in the thin film 3 an auxiliary magnetic field $+H_b$, which in turn causes a rotation of the magnetizing vector M in a counterclockwise direction. The currents $\frac{1}{2} I_o$ flowing in the thin films 1 and 4 cause in the thin films 2 and 3, respectively, an auxiliary magnetic field $-H_b$, and a rotation of the magnetizing vector M in a clockwise direction. The auxiliary fields $+H_b$ and $-H_b$ are therefore applied in a direction of the hard magnetic axis HA in such a manner so that the resulting magnetization in the thin films 1 and 4 as related to the magnetization of the thin films 2 and 3, electrically respectively connected thereto, is accomplished in respectively opposite directions. The resulting change of resistance in all thin films 1 through 4 due to this rotation of magnetization is equal in all thin films, and the Wheatstone bridge 5 therefore remains in equilibrium.

As soon as the Wheatstone bridge 5 is subjected to the external magnetic field $H_a$, the electrical resistance in the various premagnetized thin films 1 through 4 differs in respective films from one another, and results in an output voltage $U_b$ of the Wheatstone bridge, which is represented by a waveform similar to that of the external magnetic field $H_a$.

Within a permissible control range, which is limited by respective thin films of the thin film pairs 1, 2, and 3, 4 being saturated, $$U_b \approx \frac{2 \cdot \delta R}{(1 + \gamma)^2 - \gamma_{12}^2} \cdot I_o \cdot h_b \cdot h_a \tag{1}$$

where
$\Delta R$ Maximum resistance change of the thin films, $$\gamma = \frac{N \cdot M_s}{H_k},$$

A normalized demagnetization factor, $$\gamma_{12} = \frac{N_{12} \cdot M_s}{H_k},$$

A normalized coupling factor,
N Demagnetizing factor in the thin films,
$N_{12}$ The coupling factor of one thin film in a thin film pair with the other thin film,
$M_s$ The saturation magnetization,
$H_k$ The anisotrophic field strength,
$h_b = H_b/H_k$, and
$h_a = H_a/H_k$ In view of the aforedescribed state of equilibrium of the Wheatstone bridge, in the absence of an external magnetic field $H_a$, the linearity of the aforedescribed measurement transducer is not impaired by any deviations in linearity of the Wheatstone bridge 5.

In the circuit shown in FIGS. 4 and 5, the auxiliary magnetic fields $H_b$ are generated independently of the current $I_o$. The thin films 1 through 4 are disposed in a common plane, for which reasons the thin films 2 and 3 have been shown in full lines in the ame manner as thin films 1 and 4. The electrical connections of the thin films 1 through 4 correspond to those shown in FIG. 3, but have not been shown for the sake of clarity in FIGS. 4 and 5.

The generation of the auxiliary magnetic fields $H_b$ is accomplished, according to FIG. 4, by means of a current-carrying loop 30, which is disposed immediately next to the thin films 1 through 4 and insulated therefrom, an auxiliary current $I_b$ being passed therethrough. In the arrangement shown in FIG. 5 there is disposed immediately below each thin films 1 through 4 a respecctive permanently magnetized layer 13 through 16, and insulated therefrom, which couples the auxiliary magnetic field $H_b$ to the associated thin films. In each of the above cases $\gamma_{12} = 0$ In order to supress any offset voltages of the Wheatstone bridge 5, as well as any amplifiers associated therewith, in the version shown in FIG. 6, the Wheatstone bridge 5 is fed from an alternating current-source or voltage-source 17, generating, for example, a rectangular or sinusoidal waveform. Postcoupled to the output terminals 7 and 8 of the Wheatstone bridge 5 is an alternating current difference amplifier 18, to which there is postcoupled a synchronous detector 19, a filter 20, and an amplifier 21 generating the compensating current $I_h$. The synchronous detector 19 operates in synchronium with the output voltage of the different amplifier 18, namely in the same rhythm as the phase of the alternating current $I_o$. At the output of the filter 20, there is therefore generated an electrical signal proportional to the external magnetic field $H_a$ and free of any offset errors. The synchronous detector 19 shown dotted is only required if the bridge is implemented as shown in FIG. 4 or 5, namely when the auxiliary magnetic fields $H_b$ are generated independently of the current $I_o$. If, however, the auxiliary magnetic fields $H_b$ are generated as shown in FIGS. 2 and 3, by means of the current $I_o$, then the synchronous detector 19 can be omitted, because the auxiliary magnetic fields $H_b$ also change direction if the current $I_o$ changes its direction, so that, as can be seen from equation (1), the output voltage $U_b$ does not change its sign.

The aforedescribed supply of the Wheatstone bridge 5 by an alternating current or voltage, provided the Wheatstone bridge is not implemented according to FIGS. 2 and 3 and supplied by a rectangular waveform, results in a modulation of the output voltage $U_b$ of the Wheatstone bridge. This permits the use of a narrow-band frequency-selective amplifier for use as the alternating current difference amplifier 18, so that a large amplification at a good signal-to-noise ratio can be obtained. If the Wheatstone bridge 5 is implemented according to FIG. 4, then the modulation of the output voltage $U_b$ of the Wheatstone bridge can also be accomplished by the auxiliary current $I_b$ being an alternating current, so that the auxiliary field $H_b$ is an auxiliary alternating field.

If the Wheatstone bridge 5 is implemented as shown in FIGS. 2 and 3 in the circuit of FIG. 6, then the current $I_o$ and the auxiliary magnetic fields $H_b$ alternate at the same frequency $f_o$. As the Wheatstone bridge output voltage $U_b$ is proportional both to the current $I_o$, as well as to the auxiliary magnetic field $H_b$, the Wheatstone bridge output voltage $U_b$ contains a frequency component $2f_o$. Thus the second harmonic of the frequency $f_o$ can be frequency-selectively amplified in the difference amplifier 18, and any crosstalk of the frequency $f_o$ can be effectively avoided. This principle can be implemented also in a Wheatstone bridge 5 according to FIG. 4, by the auxiliary current $I_b$ and the current $I_o$ supplying the Wheatstone bridge alternating at a frequency $f_o$.

The dynamics of the aforedescribed transducer are limited by the permissible control range of the Wheatstone bridge 5. If the magnetic external field $H_a$, for example following connection of the voltage- or current-source 17 thereto, or as the result of any noise impulses, exceeds a predetermined value, then the thin films 1 through 4 may become saturated, and the negative feedback loop can no longer operate satisfactorily. By means of the circuit shown in FIG. 7 it will be shown how such a disadvantageous operation can be avoided and the dynamic range of the transducer can be increased.

Figure 7:
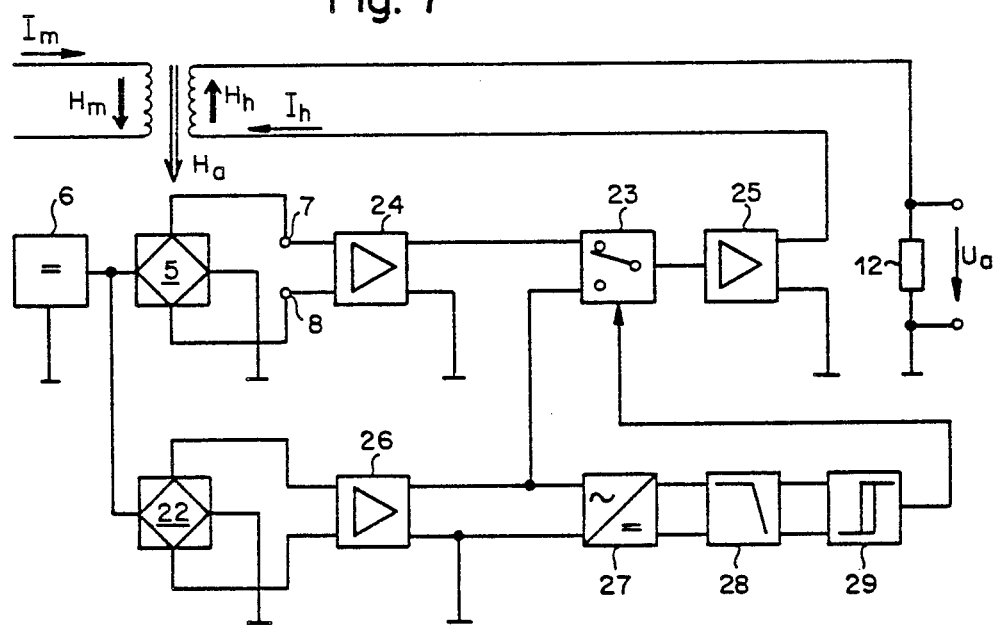
FIG. 7 is a block circuit diagram of yet another version of the present invention.

The transducer, according to FIG. 7, contains in addition to the Wheatstone bridge 7 a similar Wheatstone bridge 22, which is constructed in a similar fashion to that of the Wheatstone bridge 5, but has a control range greater than that of the Wheatstone bridge 5, and a sensitivity smaller than that of the Wheatstone bridge 5. For example the control range of the bridge 5 may be $\pm 5$ Oersted, and the control range of the Wheatstone bridge 22, for example $\pm 50$ Oersted. A switch 23 switches in one position the output of the Wheatstone bridge 5 via a difference amplifier 24 to the input of the amplifier 25, and in a second switch position switches the output of the bridge 22 via a difference amplifier 26 to the input of the amplifier 25. The amplification factor of the difference amplifier 24 and 26 remains constant. The amplifier 25 generates the compensating current $I_h$, and therefore has a high amplification factor. The output of the Wheatstone bridge 22 is supplied to the control input of the switch 23 via a difference amplifier 26, a rectifier 27, a filter 28, and a threshhold limiter 29.

During normal operation of the transducer the switch 23 remains in the position shown in FIG. 7, and the feedback control loop is closed through the sensitive Wheatstone bridge 5, the difference amplifier 24, and the amplifier 25. As long as this control loop can equalize any changes of the magnetic field $H_m$, which is generated by the current $I_m$ to be measured, the external magnetic field $H_a$ remains very small. The Wheatstone bridge 5 therefore operates in its linear region. Upon activation of the supply voltage, or supply current from the source 18, or during any noise peaks, the external magnetic field $H_a$ may exceed the control range of the Wheatstone bridge 5, and the Wheatstone bridge 5 may become saturated, so that the control loop, including the sensitive Wheatstone bridge 5, can no longer function properly. In this case, however, the output signal of the rectifier 27, serving to form an absolute value of the voltage fed thereinto, becomes so large, that the threshold circuit 29 is activated, the switch 23 is switched over, and the control loop is closed through the less sensitive Wheatstone bridge 22. As soon as the external magnetic field $H_a$ has become small enough so that the output voltage of the filter 28 is below the lower threshhold limit of the threshhold limiter 29, the Wheatstone bridge 5 reassumes its control function.

The alternating current- or voltage-amplification of the output voltage of the Wheatstone bridge 5 shown in FIG. 6 is advantageously also used in the application shown in FIG. 7 with the aid of the Wheatstone bridges 5 and 22, or the amplifiers 24 and 26.

In order to increase the dynamic range of the aforedescribed transducer, it is alternately also possible to determine the timing of the zero crossing of the magnetic field $H_m$ to be measured by means of a null indicator of the magnetic field. When the control loop is properly operating, and when $I_m = 0$ then $I_H \sim 0$, but when the Wheatstone bridge 5 is driven into a saturation region, this condition is no longer fullfilled. If the compensating current $I_h$ exceeds a predetermined value at the time of zero crossing of the magnetic field $H_m$ to be measured, then it is possible, by means of a logic circuit to so influence the control loop, that the compensating current $I_h$ is temporarily reduced to zero, so that the magnetic external field $H_a$ is reduced to a value within the sensitivity range of the Wheatstone bridge 5; then the circuit again operates within the proper sensitivity range of the control loop. a magnetoresistive thin film can again be used as a null indicator for the magnetic field.

The measurement transducer operating free of any magnetic core which has been described furnishes an exact linear replica of the current to be measured $I_m$, while galvanically separating the circuit in which the current to be measured flows, and the circuit in which a current, similar to the current to be measured, is generated, is equally suitable for measuring direct currents, or alternating current. The thin films 1 through 4 of the Wheatstone bridges 5 and 22, the electronic components, and the compensating current conductor 10 which, if needed, can be formed as a thin-film coil, may be manufactured as integrated circuits and be incorporated into a single semiconductor substrate.

We wish it to be understood that we do not desire to be limited to the exact details of construction shown and described, for obvious modifications will occur to a person skilled in the art.

Having thus described the invention, what we claim as new and desire to be secured by Letters Patent is as follows:

1. A device for measuring a current which generates a first magnetic field, said current being measured by producing a second current, said second current generating a second magnetic field oppositely oriented to said first magnetic field, said current measuring device comprising:
   a Wheatstone bridge comprising two pairs of magneto-resistive films, each of said films having a hard axis and an easy axis, and
   means for generating auxiliary magnetic fields oriented along said hard axes of said films for rotating the magnetization of one film in each pair on the clockwise direction and for rotating the magnetization of the other film in each pair in the counterclockwise direction,
   said Wheatstone bridge producing an output signal dependent upon the difference between said first and second magnetic fields when said first and second magnetic fields are oriented along said hard axes of said films, said output signal being adapted to control the magnitude of said second current so that said second current becomes equal to said first current and said second magnetic field becomes equal to said first magnetic field, said current sensing device including means for obtaining the magnitude of said second current.

2. The current measuring device of claim 1 wherein said magneto-resistive films are disposed in a common plane and wherein said means for generating said auxiliary magnetic fields includes a current-carrying loop located near said films.

3. The current measuring device of claim 1 wherein said magneto-resistive films are disposed in a common plane and wherein said means for generating said auxiliary magnetic fields includes a permanently magnetized layer disposed near said films.

4. The current measuring device of claim 1 wherein said Wheatstone bridge is driven by an AC source.

5. The current measuring device of claim 4 wherein said current measuring device further includes an alternating current differential amplifier coupled to the output of said Wheatstone bridge, a synchronous detector coupled to said alternating current differential amplifier and a filter coupled to said synchronous detector, whereby any measurement error due to direct current offset of said Wheatstone bridge is substantially eliminated.

6. The current measuring device as claimed in claim 1 wherein said auxiliary magnetic fields are alternating magnetic fields and wherein said device further includes an alternating current differential amplifier coupled to said Wheatstone bridge and a filter coupled to said alternating current differential amplifier.

7. The current measuring device of claim 6 wherein said alternating current differential amplifier is a frequency selective narrow band alternating current differential amplifier.

8. The current measuring device as claimed in claim 1 wherein said Wheatstone bridge has a first operating range and wherein said current measuring device further comprises a second Wheatstone bridge also comprising four magneto-resistive films, said second Wheatstone bridge having a second operating range larger than said first operating range, detection means connected to one of said bridges for sensing an output thereof for indicating when said first operating range has been exceeded, and switch means coupled to said detection means for substituting said second Wheatstone bridge for said Wheatstone bridge having said first operating range upon said detection means sensing that said first operating range has been exceeded and for replacing said second Wheatstone bridge by said Wheatstone bridge having said first operating range when said detection means indicates operation within said first operating range.

* * * * *